(12) United States Patent
Asakura et al.

(10) Patent No.: US 10,048,323 B2
(45) Date of Patent: Aug. 14, 2018

(54) POWER SUPPLY DEVICE INCLUDING A FILTER CIRCUIT THAT ATTENUATES A SPECIFIED FREQUENCY COMPONENT OF ANALOG SIGNALS CORRESPONDING TO TERMINAL POTENTIALS OF BATTERY CELLS CONNECTED IN SERIES

(71) Applicant: SANYO Electric Co., Ltd., Osaka (JP)

(72) Inventors: Jun Asakura, Hyogo (JP); Tomoyuki Matsubara, Hyogo (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 43 days.

(21) Appl. No.: 15/304,670

(22) PCT Filed: Apr. 24, 2015

(86) PCT No.: PCT/JP2015/002224
§ 371 (c)(1),
(2) Date: Oct. 17, 2016

(87) PCT Pub. No.: WO2015/162937
PCT Pub. Date: Oct. 29, 2015

(65) Prior Publication Data
US 2017/0038434 A1 Feb. 9, 2017

(30) Foreign Application Priority Data
Apr. 25, 2014 (JP) .................. 2014-091018

(51) Int. Cl.
*G01R 31/36* (2006.01)
*G01R 19/00* (2006.01)
(Continued)

(52) U.S. Cl.
CPC ......... *G01R 31/3658* (2013.01); *G01R 19/00* (2013.01); *G01R 31/36* (2013.01);
(Continued)

(58) Field of Classification Search
CPC ...... G01R 19/00; G01R 31/36; G01R 31/362; G01R 31/3658; H01M 10/425; H01M 10/48; H02J 7/0021; H02J 7/02
(Continued)

(56) References Cited

U.S. PATENT DOCUMENTS

| 2009/0295398 A1 | 12/2009 | Ohnuki | |
|---|---|---|---|
| 2010/0134115 A1 | 6/2010 | Ohnuki | |
| 2013/0057294 A1* | 3/2013 | Mizoguchi | ........... G01R 31/362 324/434 |

FOREIGN PATENT DOCUMENTS

| EP | 2413152 A4 * | 12/2016 | ......... G01R 31/3658 |
|---|---|---|---|
| JP | 2009-150867 | 7/2009 | |

(Continued)

OTHER PUBLICATIONS

International Search Report of PCT application No. PCT/JP2015/002224 dated Jul. 21, 2015.

*Primary Examiner* — Jay Patidar
(74) *Attorney, Agent, or Firm* — Wenderoth, Lind & Ponack, L.L.P.

(57) ABSTRACT

A power supply device includes: an assembled battery that is configured of N pieces of battery cells connected in series; (N+1) pieces of measurement lines that obtain analog signals corresponding to terminal potentials of the battery cells; a filter circuit that attenuates a specified frequency component of the inputted analog signals and outputs; and an analog/digital converter that converts the analog signals outputted from the filter circuit into digital signals. The filter circuit is configured of: (N+1) pieces of input terminals; (N+1) pieces of output terminals; (N+1) pieces of filter resistors; and (N+1) pieces of filter capacitors of which one ends respectively connected between the filter resistors and the output terminals and the other ends are connected to each other in common.

2 Claims, 3 Drawing Sheets

(51) Int. Cl.
  *H01M 10/48*  (2006.01)
  *H02J 7/02*   (2016.01)
  *H01M 10/42*  (2006.01)
  *H02J 7/00*   (2006.01)

(52) U.S. Cl.
  CPC ........ *G01R 31/362* (2013.01); *H01M 10/425* (2013.01); *H01M 10/48* (2013.01); *H02J 7/0021* (2013.01); *H02J 7/02* (2013.01)

(58) Field of Classification Search
  USPC ....................................................... 324/434
  See application file for complete search history.

(56) References Cited

FOREIGN PATENT DOCUMENTS

JP      2010-181168         8/2010
JP      WO 2014203822 A1 *  12/2014  ....... G01R 19/16542

* cited by examiner

POWER SUPPLY DEVICE INCLUDING A FILTER CIRCUIT THAT ATTENUATES A SPECIFIED FREQUENCY COMPONENT OF ANALOG SIGNALS CORRESPONDING TO TERMINAL POTENTIALS OF BATTERY CELLS CONNECTED IN SERIES

TECHNICAL FIELD

The present invention relates to a power supply device including an assembled battery in which a plurality of battery cells are connected in series, and a voltage detector which detects each of the battery cells.

BACKGROUND ART

In a power supply device including an assembled battery configured of a plurality of battery cells, in order to prevent battery cells from being in abnormal states of over charge, over discharge, or the like, a state monitoring portion always monitors voltage, temperature, or the like of each of the secondary battery cells. Especially, in a case of using the assembled battery in which the plurality of the battery cells are connected in series, an voltage detector as the state monitoring portion for detecting the voltage of each of the battery cells, is provided. The detected voltage of each of the battery cells is used for controls of charge and discharge.

The voltage detector obtains an terminal electrical potential of each of the battery cells constituting the assembled battery, and detects the voltage of each of the battery cells through differential amplifiers or analog/digital converters. At this time, depending on a relation of frequency input signal inputted into the analog/digital converter and sampling frequency of the analog/digital converter, the accuracy of the voltage detection may decrease. Concretely, it is necessary that the maximum frequency of an analog signal inputted into the analog/digital converter does not exceed the half value (Nyquist frequency) of the sampling frequency. When the analog signal includes the frequency component which the Nyquist frequency, the input signal overlaps. In a case where the input signal overlaps, the output signal of the analog/digital converter becomes the digital signal including unnecessary signal information (aliasing error), the accuracy of the digital signal decreases.

As a method which resolves this problem, a power supply device which has a filter circuit between each of the battery cells and the analog/digital converter, has been known (Patent Literature 1). The filter circuit of Patent Literature 1 is a low pass filter, and when the analog signal corresponding to a potential of each of the battery cells is inputted into the filter circuit, the filter circuit attenuates the signal of the frequency equal to or more than the cutoff frequency corresponding to each of the analog signals, and outputs such a signal to analog/digital converter. By this configuration, the maximum frequency of the analog signal inputted into the analog/digital converter, can be decreased, and an occurrence of the aliasing error is prevented.

In the power supply device of Patent Literature 1, the capacities of the capacitors or the resistance values of the resistors are respectively set at most appropriate values, and then the frequency response of each of the outputs in the filter circuits can be equalized, while a resistor connected between the battery modules is common. Thus, it is necessary that the filter circuit has the same frequency response in each of the outputs in order to accurately detect the voltages.

CITATION LIST

Patent Literature

Patent Literature 1: Japanese Laid-Open Patent Publication No. 2009-150867

SUMMARY OF THE INVENTION

Technical Problem

As mentioned above, the frequency response of the filter circuit is set by the circuit constance of the capacitor and the resistor constituting the filter circuit. The types of standardized capacitors (general-purpose capacitor) are limited, compared with the resistors. In a case where the filter circuit is actually designed, the frequency response of the filter circuit is adjusted by the resistance value, according to the capacitance of the selected capacity.

However, in the configuration of Patent Literature 1, the capacitances of the capacities are different corresponding to the number of series connections in the battery module or the position of the corresponding battery module, and the optimum values are set by calculation. Therefore, it is necessary that the capacitors having different capacitances are prepared corresponding to the number of series connections of the battery cells. Since the optimum value of the capacitance in each of the capacitors is decided by calculation, the capacitor which has the capacitance coinciding with the calculated optimum value, is not necessarily standardized. In the power supply device of Patent Literature 1, when there is no capacitor which has the capacitance coinciding with the calculated optimum value, a capacitor near the characteristics is used as a substitution, and then there is a problem that the frequency responses of the outputs in the filter circuit become different.

The present invention is made to resolve such a problem, and an object is to supply a technology where frequency responses of outputs in a filter circuit can be easily equalized.

Solution to Problem

In order to resolve the above problem, a power supply device of an explanatory embodiment of the present invention, includes: an assembled battery that is configured of N (N is an optional natural number) pieces of battery cells connected in series; (N+1) pieces of measurement lines that obtain analog signals corresponding to terminal potentials of the battery cells; a filter circuit that attenuates a specified frequency component of the analog signals inputted through the (N+1) pieces of measurement lines, and outputs; and an analog/digital converter that converts the analog signals outputted from the filter circuit into digital signals. The filter circuit includes: (N+1) pieces of input terminals that are connected to the (N+1) pieces of the measurement lines; (N+1) pieces of output terminals corresponding to the (N+1) pieces of the input terminals; (N+1) pieces of filter resistors that each have the same resistance value and each have an input terminal and an output terminal; and (N+1) pieces of filter capacitors that each have the same capacitance. One end of each of the (N+1) pieces of the filter capacitors is connected between each of the (N+1) pieces of filter resistors and each of the (N+1) pieces of the output terminals, another end of each of the (N+1) pieces of the filter capacitors is connected to each other in common.

Advantageous Effects of Invention

According to an explanatory embodiment of the present invention, by using filter capacitors having the about same capacitance and filter resistors having the about same resistance value, frequency responses of outputs in a filter circuit can be easily equalized. The filter circuit which equalizes the frequency responses can be formed by circuit components having standardized circuit constance (capacitance, resistance value, or the like).

BRIEF DESCRIPTION OF DRAWINGS

FIG. 3A is a circuit diagram of the filter circuit of the embodiment. FIG. 3B is an equivalent circuit of FIG. 3A, when an output corresponding to an input voltage $V2_{in}$ of the second battery cell from the high potential is thought as a target in FIG. 3A. FIG. 3C is an equivalent circuit of FIG. 3B in which nodes of equal potentials are arranged in FIG. 3B.

DESCRIPTION OF EMBODIMENTS

Figure 1:
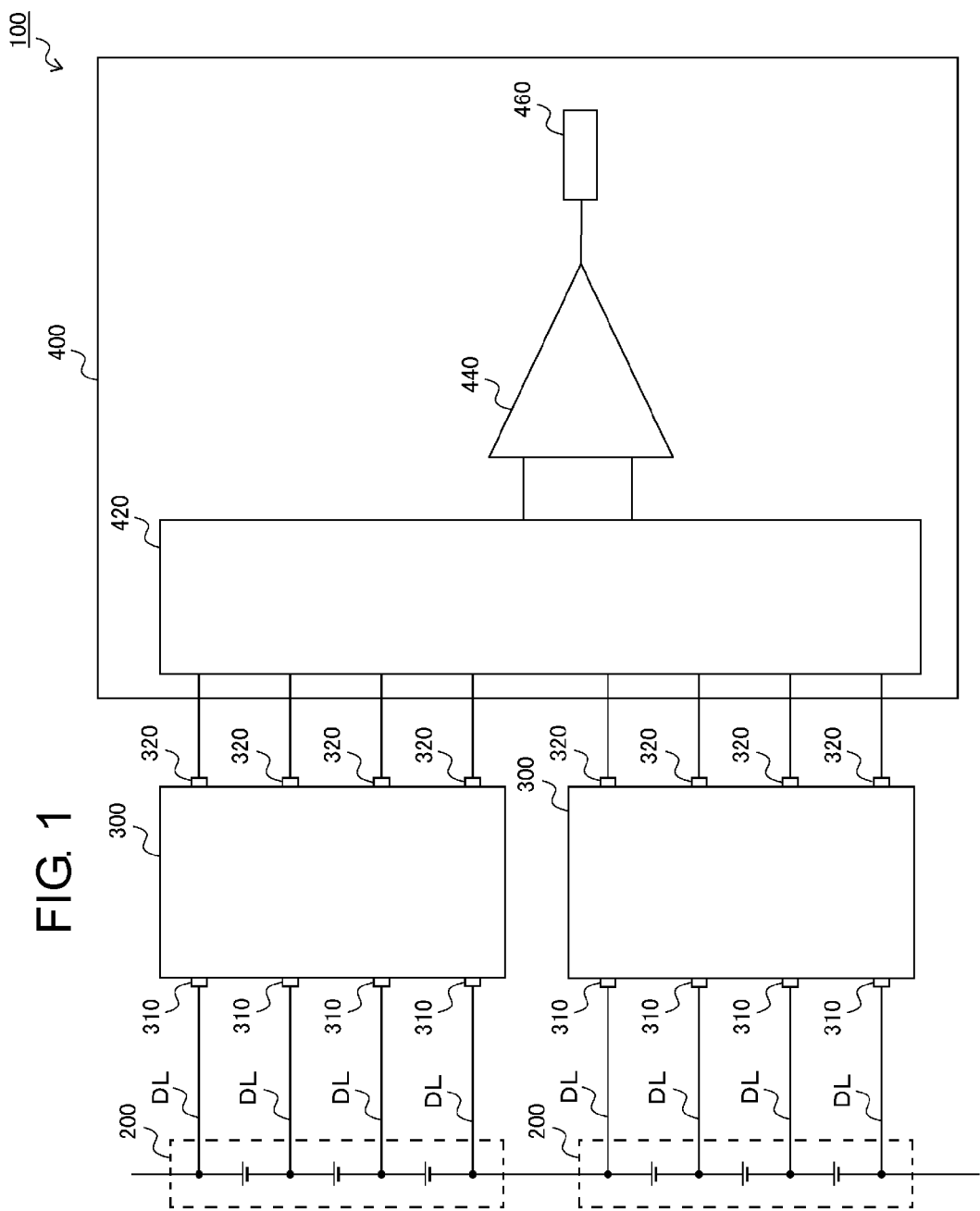
FIG. 1 is a circuit diagram showing a configuration of a power supply device of an embodiment of the present invention.

FIG. 1 is a general schematic circuit diagram of power supply device 100 relating to an embodiment of the present invention. Power supply device 100 relating to the embodiment, includes a plurality of assembled batteries 200 which are used as a power source mounted in a vehicle or a power storage device, filter circuits 300 which obtain analog signals from assembled batteries 200 and attenuate a specified frequency component exceeding a predetermined cutoff frequency and output, and state monitoring portion 400 into which analog signals outputted from filter circuits 300 are inputted and which monitors a state of assembled batteries 200 based on the inputted analog signals. Each of filter circuits 300 is provided with each of assembled batteries 200, and has a plurality of input terminal 310 and a plurality of output terminal 320. Further, power supply device 100 has measurement lines DL which connect input terminals 310 of filter circuits 300 and electrode terminals of battery cells constituting corresponding assembled batteries 200.

Each of the outputs of the plurality of the filter circuits 300 is inputted into state monitoring portion 400, and state monitoring portion 400 includes switch portion 420 which selects an arbitrary output, differential amplifier circuit 440 into which the output selected by switch portion 420 is inputted, analog/digital converter 460. Switch portion 420 is a switching circuit which periodically selects one of the inputs and outputs, and can specify the battery cell as a detecting target corresponding to the measured value. Differential amplifier circuit 440 amplifies the inputted analog signal, and outputs to analog/digital converter 460.

Analog/digital converter 460 converts the inputted analog signal into the digital signal in a predetermined sampling period. When the analog signal is sampled in the predetermined sampling period (fs), the difference frequency signal (fs−fi) and the sum frequency signal (fs+fi) are newly generated in response to the frequency of the analog signal (fi). Accordingly, when the sampling period becomes short, the frequency of the analog signal and the difference frequency signal (fs−fi) may be overlapped. Actually, the analog signal obtained from the battery cells constituting the assembled battery, is the spectrum including many kinds of frequency components. When the sampling frequency is set such that the difference sampling frequency (fs−fimax≤fimax) becomes small to its maximum frequency component fimax, the spectrums of the detected signal are overlapped, and then noise is mixed in the output of the digital signal of analog/digital converter 460.

Generally, in a case where the sampled analog signal is converted to the digital signal, in order to prevent the mixture of the noise as mentioned above, the sampling frequency is set at an adequate speed. The half frequency of the sampling frequency is called as Nyquist frequency. Concretely, it is necessary that the sampling period is set such that this Nyquist frequency is more than the maximum frequency component of the analog signal. When the sampling period of analog/digital converter 460 is set at a short time, the mixture of the noise can be easily prevented. However, when the sampling period is extremely short, the sampled data volume may be increased. Especially, when a computing processing is carried out by using the sampled data, a time length for computing is increased due to the enormous data volume. Therefore, there is a limit to the speed-up of the sampling speed.

Filter circuit 300 is effective in a case where a sampling period of analog/digital converter 460 cannot be set at an adequate speed due to a limit to a measuring device as a voltage detection circuit or an analog/digital converting board. As mentioned above, filter circuit 300 is a low pass filter, and attenuates the frequency equal to or more than a cutoff frequency in response to the analog signal obtained from measurement line DL. Thus, it is suppressed that the maximum frequency component of the analog signal inputted into analog/digital converter 460 exceeds Nyquist frequency.

Like the power supply device of the present invention, in the assembled battery which are used as a power source mounted in a vehicle or a power storage device, SOC (charge rate) or degradation degree in each of the battery cells is calculated by using the measured values obtained from the assembled battery. Therefore, the sampling speed cannot be set at a high speed. According, the filter circuit is substantially an indispensable configuration, but the filter circuit needs a lot of the resistors or capacitors, and then the cost of the power supply device may be increased. In order to reduce the cost of the power supply device, suppressing the withstand voltage of the capacitor or the commonition of wiring is effective.

Figure 2:
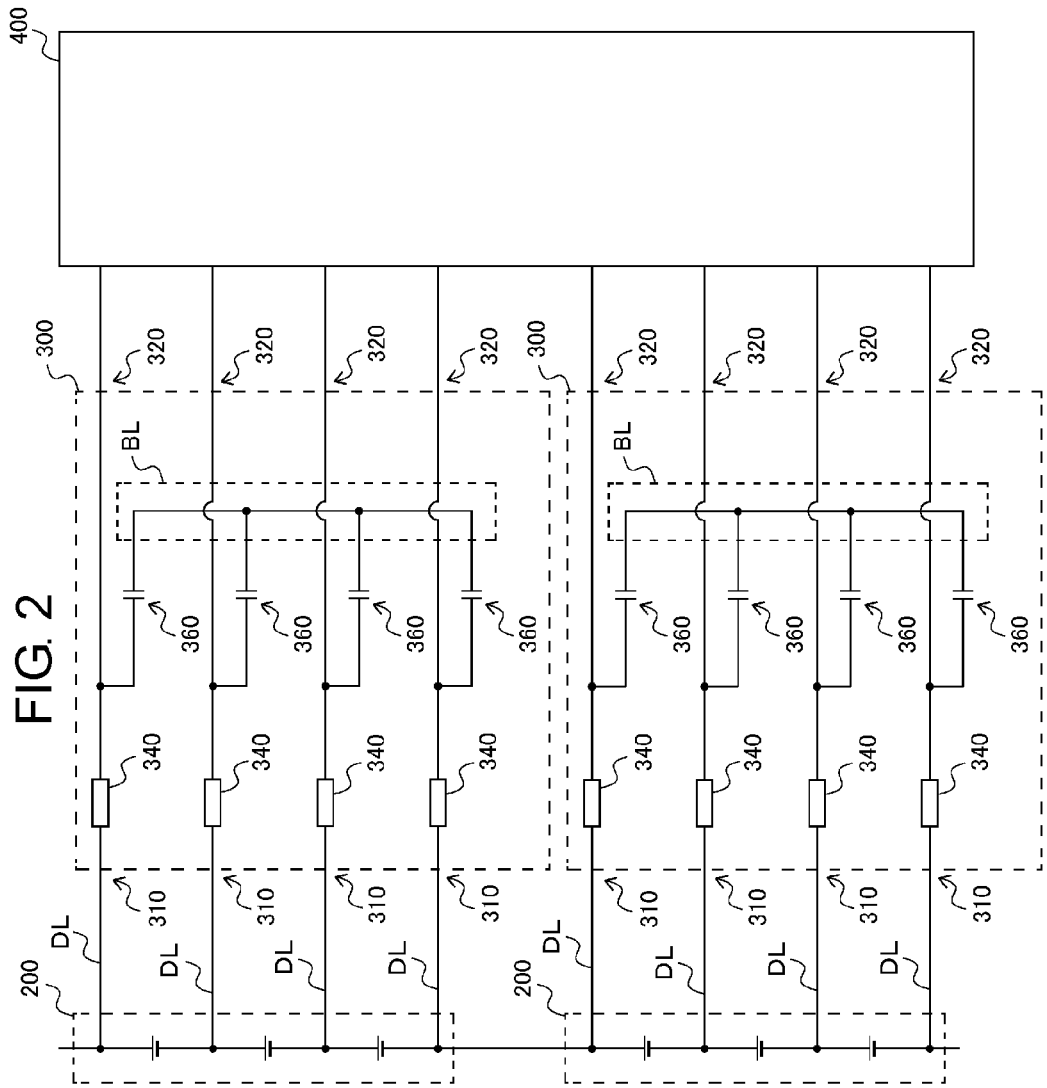
FIG. 2 is a circuit diagram showing a configuration of a filter circuit of the embodiment of the present invention.

FIG. 2 is a circuit diagram showing a configuration of the filter circuit of the embodiment of the present invention. Each of assembled batteries 200 has three pieces of the battery cells connected in series. Power source device 100 has four lines of measurement line DL for obtaining the analog signals, and measurement line DL is connected to the electrode terminal of each of the battery cells. Filter circuit 300 has four input terminals 310 which are respectively connected to measurement lines DL, and four output terminals 320 corresponding to four input terminals 310. Filter circuit 300 includes four filter resistors 340 which input terminals 310 are respectively connected to output terminals 320, four filter capacitors 360 of which one ends respectively connected between the filter resistors 340 and the output terminals 320, and common line BL which is connected to the other ends of filter capacitors 360. Common line BL is floating to a ground. Here, "floating" means that the electric potential of common line BL is in an independent state to the ground.

In this configuration, each of output terminal 320 is connected to the adjacent output terminal 320 through two filter capacitors 360 connected in series. In filter circuit 300 of FIG. 2, each of filter capacitors 360 has the same capacitance. Further, each of filter resistor 340 has the same resistance value.

Here, FIG. 2 shows the circuit diagram where each of filter capacitor 360 is configured of one capacitor component, and each of filter resistor 340 is configured of one resistor component. However, a plurality of circuit components may constitute filter capacitor 360 or filter resistor 340.

Since filter circuit 300 is not IC, and is configured to assemble circuit components mounted on the circuit board, filter circuit 300 does not necessarily need to have input terminal 310 or output terminal 320. For example, the electrode terminal of the battery cell and filter circuit 300, or filter circuit 300 and state monitoring portion 400 may be connected by lead wires or circuit patterns of a circuit board in a seamless structure. Input terminal 310 or output terminal 320 in this specification includes such a configuration as the person of ordinary skill in the art can understand.

Next, the frequency response of the filter circuit shown in FIG. 2, will be explained. The filter circuit shown in FIG. 2 of the one embodiment of the present invention has the following configuration as generalization.

Assembled battery 200 is configured of N pieces (N is an optional natural number (positive integer)) of the battery cells connected in series. The (N+1) pieces of measurement lines DL are connected to assembled battery 200, and measurement lines DL are respectively connected to the electrode terminals of N pieces of the battery cells. Filter circuit 300 has (N+1) pieces of input terminals 310 and (N+1) pieces of output terminals 320, and measurement lines DL are connected to the corresponding input terminals 310. Filter circuit 300 has (N+1) pieces of filter resistors 340, and each of filter resistor 340 is provided so as to connect the corresponding input terminal 310 and output terminal 320. Filter circuit 300 has (N+1) pieces of filter capacitors 360, and one end of each of the (N+1) pieces of filter capacitors 360 is connected between each of the (N+1) pieces of filter resistors 340 and each of the (N+1) pieces of output terminals 320, and the other ends are connected to common line BL.

Figure 3A:
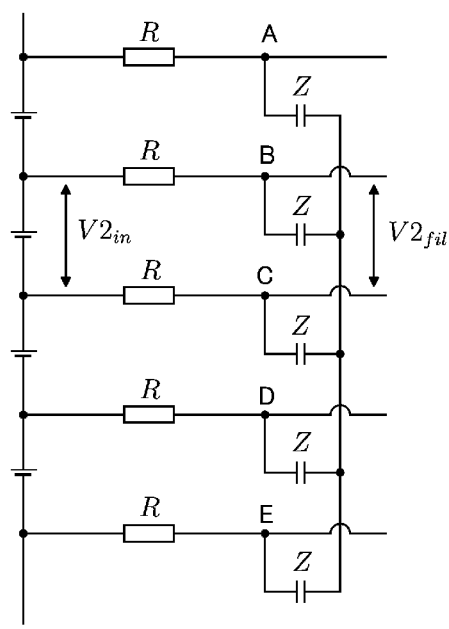
FIG. 3A, FIG. 3B, and FIG. 3C are circuit diagram illustrating input-to-output ratio of the filter circuit of the embodiment of the present invention. Concretely.
Figure 3B:
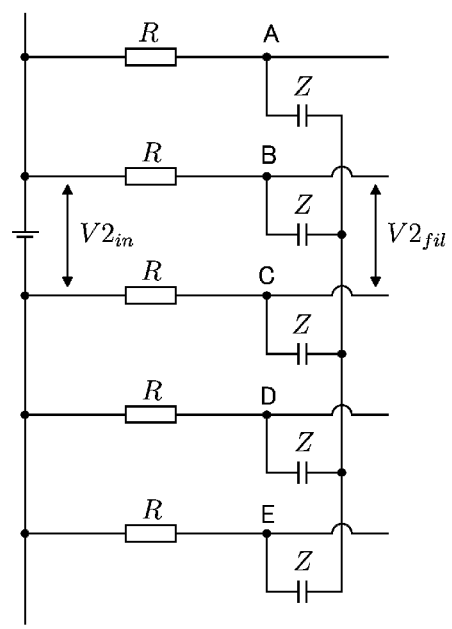
Figure 3C:
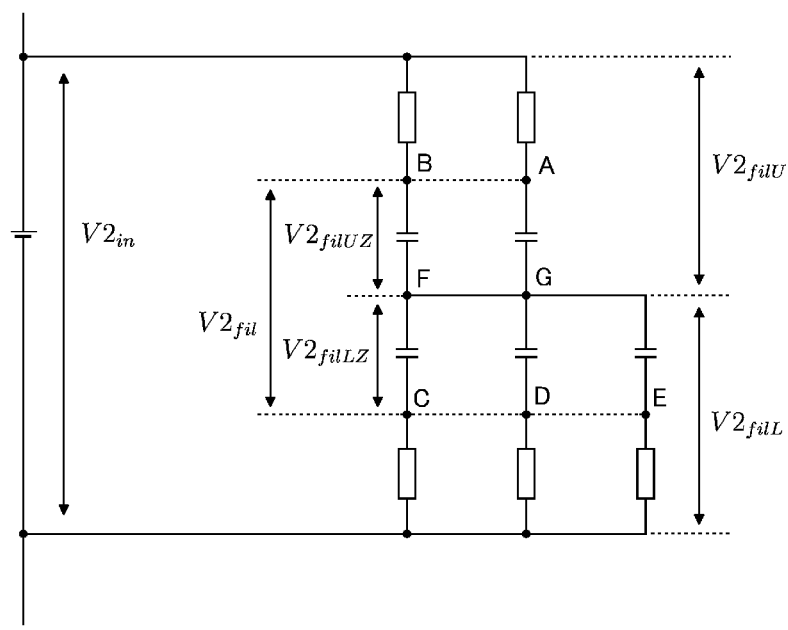

FIGS. 3A to 3C are circuit diagrams illustrating a deriving method of frequency response in the one embodiment of the present invention. Concretely, in the generalized circuit configuration mentioned above, FIGS. 3A to 3C show filter resistors of N=4. In FIG. 3A, input voltage V2in of the second battery cell from the high potential among the four battery cells, is thought as a target. As it is necessary to consider an alternating current component, filter capacitor 360 uses impedance Z which shows an orthogonal component of a complex number. Impedance Z is expressed as the next numerical formula. Here, j is a complex number, and ω is an angular frequency, and C is a capacitance of filter capacitor 360.

$$Z = -1/j\omega C \quad \text{[formula 1]}$$

As mentioned above, in the embodiment of the present invention, each of filter resistors 340 has the same resistance value R, and each of filter capacitor 360 has the same impedance Z.

The voltage variation other than the target battery cell, does not affect output voltage $V2_{fil}$ of filter circuit 300 corresponding the watched second battery cell. Therefore, FIG. 3A is substantially the same as FIG. 3B.

FIG. 3B is arranged, and is equal to FIG. 3C. Concretely, filter resistors 340 and filter capacitor 360 are connected in series, and constitute RC circuits, and then the two parallel RC circuits and the three parallel RC circuits are connected in series. Combined impedance $Z_2$ of the two parallel circuits is $Z_2=(R+Z)/2$. Combined impedance $Z_3$ of the three parallel circuits is $Z_3=(R+Z)/3$. Voltage $V2_{in}$ is inputted into filter circuit 300, and is divided by combined impedances $Z_2$, $Z_3$.

FIG. 3C illustrates such that the same electrical potentials are located at the same height. Nodes A to E shown in FIG. 3B correspond to Node A to E of FIG. 3C. Nodes A, B are the same potential, and nodes C, D, E are the same potential, and nodes F, G are the same potential. Output voltage $V2_{fil}$ of filter circuit 300 to input voltage $V2_{in}$ is the sum value of voltage $V2_{filUZ}$ between nodes B, F, and voltage $V3_{filLZ}$ between nodes F, C from voltage $V2_{fil}$.

Next, power supply device 100 having the assembled battery configured of N pieces (N is an optional natural number) of the battery cells connected in series, is considered. The battery cell located at m-th (m is a natural number of 1≤m<N) from the highest battery cell, is considered as a target. As illustrated in FIGS. 3A to 3C, in filter circuit 300, the m parallel RC circuit(s) and the (N−m+1) parallel RC circuit(s) are connected in series. The combined impedances of the RC circuits are expressed as the following formulas.

$$Z_m = \frac{R+Z}{m} \quad \text{[formula 2]}$$

$$Z_{N-m+1} = \frac{R+Z}{N-m+1} \quad \text{[formula 3]}$$

Voltage $Vm_{in}$ is inputted into filter circuit 300, and is divided by combined impedances $Z_m$, $Z_{N-m+1}$. Voltages $Vm_{filU}$, $Vm_{filL}$ corresponding to the combined impedances $Z_m$, $Z_{N-m+1}$ are expressed as the following $$Vm_{filU} = \frac{\frac{R+Z}{m}}{\frac{R+Z}{m}+\frac{R+Z}{N-m+1}} Vm_{in} \quad \text{[formula 4]}$$

$$Vm_{filL} = \frac{\frac{R+Z}{N-m+1}}{\frac{R+Z}{m}+\frac{R+Z}{N-m+1}} Vm_{in} \quad \text{[formula 5]}$$

In the same way, voltages $Vm_{filU}$, $Vm_{filL}$ are divided by resistance value R and impedance Z. V voltage $Vm_{filUZ}$ corresponding to voltage $V2_{filUZ}$, the voltage $Vm_{filLZ}$ corresponding to voltage $V2_{filLZ}$ are expressed as the following formulas.

$$Vm_{filUZ} = \frac{Z}{R+Z} Vm_{filU} \quad \text{[formula 6]}$$

$$Vm_{filLZ} = \frac{Z}{R+Z} Vm_{filL} \quad \text{[formula 7]}$$

Therefore, the input-to-output ratio of filter circuit 300 is expressed as the following formula, from the formulas 4 to 7. as shown in the formula 8, it is expressed by using only impedance Z of filter capacity 360 and resistance value R of filter resistance 340.

$$Vm_{fil} = Vm_{filUZ} + Vm_{filLZ}$$  [formula 8]
$$= \frac{Z}{R+Z}(Vm_{filL} + Vm_{filU})$$
$$= \frac{Z}{R+Z}Vm_{in}$$

Here, the formula is changed so as to express by using actual numeral values of the circuit constances. Vmfil is actually function Vmfil (ω) of the angular frequency ω, and the following formula is obtained by using the formula 1.

$$Vm_{fil}(\omega) = \frac{Z}{R+Z}Vm_{in}(\omega)$$ [formula 9]
$$= \frac{1/j\omega C}{R + 1/\omega C}Vm_{in}(\omega)$$
$$= \frac{1 - j\omega RC}{1 + (\omega RC)^2}Vm_{in}(\omega)$$

$$\left|\frac{Vm_{fil}(\omega)}{Vm_{in}(\omega)}\right| = 1 \Big/ \sqrt{1+(\omega RC)^2}$$ [formula 10]

As mentioned above, the input-to-output ratio of filter circuit 300 in the embodiment of the present invention, is expressed using only the circuit constances of filter resistor 340 and filter capacitor 360 which constitute filter circuit 300 as the function of ω (frequency response).

In the formula 10, the frequency response of filter circuit 300 does not depend on m, apparently. Since m shows the number of the target battery cell, it is easily understood from the formula 10 that the frequency responses of the outputs of filter circuit 300 coincide with each other. Thus, according to the explanatory embodiment shown in FIG. 2 of the present invention, by using filter capacitors 360 having the same capacitance and filter resistors 340 having the same resistance value, the frequency responses of the outputs of filter circuit 300 can be equalized.

Here, as mentioned above, the main object of the present invention is to supply the technology where the frequency responses of the outputs in the filter circuit can be easily equalized while using the standardized circuits component. Accordingly, it is apparent that "the same" of the present invention is not the same in the strict sense of the word, and shows a scope including errors to some degree. Concretely, even though capacitors have the same nominal capacitance, their actual capacitances are slightly different due to the manufacturing errors or the like (product variation). The capacitors having different capacitances caused by such a product variation are regarded substantially as "the same". The person of ordinary skill in the art, can understand that it is in the scope of claims of the present invention.

According to the configuration of the above power supply device, since it is not necessary that common line BL is connected to the ground, when such a configuration is applied to a high voltage battery system, appropriate number of the battery cells constitutes each of assembled batteries 200, and filter circuit 300 can be provided in each of assembled batteries. Additionally, since it is not necessary that common line BL is connected to the ground, arbitrary series number of the battery cells constitutes one assembled battery, and a filter circuit can be provided in each of assembled batteries. According to this configuration, since a voltage applied to filter capacitor 360 constituting filter circuit 300 can be suppressed, and then capacity components having a comparatively low withstand voltage, can constitute filter capacitors 360. Especially, in the high output of the power supply device, the total voltage of the power supply device becomes 200 to 300 V. Then, by adopting the filter circuit of the present invention, a large voltage can be prevented from being applied to the capacitor components constituting filter circuit 300.

Further, as shown in the formula 10, the frequency response of filter circuit 300 of the present invention, does not depend on the number of the battery cells constituting assembled battery 200, and is decided by the capacitance of filter capacitor 360 and the resistance value of filter resistor 340. Then, it can correspond to different series numbers of assembled batteries without changing design.

Also, in the configuration of FIG. 2, two capacitor components are surely connected in series between output terminals 320 of filter circuit 300. Therefore, even though one of the capacitor components has a short failure, discharge of the battery cells through filter resistors 340 can be prevented.

Here, in the above embodiment as one example, each of the outputs of the plurality of the filter circuits 300 is inputted into state monitoring portion 400, and state monitoring portion 400 includes switch portion 420 which selects an arbitrary output, differential amplifier circuit 440 into which the output selected by switch portion 420 is inputted, analog/digital converter 460. As long as a plurality of analog signals are analog/digital converted, it does not matter what the configuration is. For example, in state monitoring portion 400, each of the outputs of a plurality of filter circuit 300 is converted to the digital signal by the analog/digital converter, and then the digital signal can be shifted to the same potential level.

The embodiment of the present invention is explained above. The above explanation is made based on the embodiments of the present invention. The person of the ordinary skill in the art can understand that these embodiments are illustrated, and these constitution elements and these combined processes can be modified, and such modified examples are covered by the scope of the present invention.

The invention claimed is:

1. A power supply device comprising:
   an assembled battery that is configured of N pieces of battery cells connected in series, wherein N is a natural number;
   N+1 pieces of measurement lines that obtain analog signals corresponding to terminal potentials of the battery cells;
   a filter circuit that attenuates a specified frequency component of each of the analog signals inputted through the N+1 pieces of measurement lines, and outputs analog signals; and
   an analog/digital converter that converts the analog signals output from the filter circuit into digital signals,
   wherein the filter circuit is floating to a ground, the filter circuit comprising:
   N+1 pieces of input terminals that are connected to the N+1 pieces of the measurement lines;
   N+1 pieces of output terminals corresponding to the N+1 pieces of the input terminals;
   N+1 pieces of filter resistors that each have the same resistance value and each have an input terminal and an output terminal; and
   N+1 pieces of filter capacitors that each have the same capacitance, wherein one end of each of the N+1 pieces of the filter capacitors is connected between each of the N+1 pieces of filter resistors and each of the N+1 pieces of the output terminals, another end of each of the N+1 pieces of the filter capacitors is connected to each other in common.

2. The power supply device according to claim 1,
wherein each of the filter capacitors includes at least one capacitor element,
each of the filter resistors includes at least one resistor element.

* * * * *